(12) United States Patent
Ghabra et al.

(10) Patent No.: US 7,116,214 B2
(45) Date of Patent: Oct. 3, 2006

(54) CIRCUIT BOARD ASSEMBLY WITH INTEGRAL ANTENNA

(75) Inventors: Riad Ghabra, Dearborn Heights, MI (US); David A. Michalski, Troy, MI (US); Helena Thornton, Dearborn, MI (US)

(73) Assignee: Lear Corporation, Southfield, MI (US)

( * ) Notice: Subject to any disclaimer, the term of this patent is extended or adjusted under 35 U.S.C. 154(b) by 166 days.

(21) Appl. No.: 10/942,718

(22) Filed: Sep. 16, 2004

(65) Prior Publication Data

US 2006/0055517 A1    Mar. 16, 2006

(51) Int. Cl.
B60R 25/10    (2006.01)

(52) U.S. Cl. ............... 340/426.11; 340/426.1; 340/426.3; 340/426.31; 340/539.1; 340/541; 340/572.1; 340/825.69

(58) Field of Classification Search ........... 340/426.11, 340/426.1, 426.16, 426.31, 428, 541, 572.1, 340/572.8, 825.69, 426.3, 539.1; 307/10.1, 307/10.2, 10.5; 701/36, 49
See application file for complete search history.

(56) References Cited

U.S. PATENT DOCUMENTS

| | | | | |
|---|---|---|---|---|
| 5,532,522 A | * | 7/1996 | Dietz et al. | 340/5.61 |
| 5,679,984 A | * | 10/1997 | Talbot et al. | 307/10.3 |
| 5,729,057 A | * | 3/1998 | Frenzel et al. | 307/10.3 |
| 6,043,568 A | * | 3/2000 | Matsumoto et al. | 307/10.5 |
| 6,181,026 B1 | | 1/2001 | Treharne et al. | |
| 6,188,140 B1 | | 2/2001 | Kito et al. | |
| 6,211,839 B1 | | 4/2001 | Campbell | |
| 6,366,197 B1 | | 4/2002 | Tarquinio | |
| 6,400,040 B1 | | 6/2002 | Scudder et al. | |
| 6,703,929 B1 | | 3/2004 | Baudard | |
| 2001/0045909 A1 | | 11/2001 | Eggleston | |
| 2002/0036594 A1 | | 3/2002 | Gyenes | |
| 2002/0171589 A1 | | 11/2002 | Nistler et al. | |

FOREIGN PATENT DOCUMENTS

| | | |
|---|---|---|
| DE | 4432000 | 4/1995 |
| DE | 29623484 | 7/1998 |
| EP | 0355475 | 2/1990 |
| EP | 0356720 | 3/1990 |
| EP | 0695676 | 2/1996 |
| JP | 2004123030 | 4/2004 |

* cited by examiner

Primary Examiner—Hung Nguyen
(74) Attorney, Agent, or Firm—MacMillan, Sobanski & Todd, LLC

(57) ABSTRACT

A circuit board assembly for use in a vehicle immobilizer system in accordance with the present invention includes a printed circuit board for mounting in an interior portion of the vehicle and having an aperture formed therethrough. The aperture is defined by an interior wall of the printed circuit board. An antenna trace is printed on the circuit board proximate to the interior wall defining the aperture. An ignition switch assembly extends through the aperture of the circuit board. The ignition switch is operable to receive a key having a transponder disposed thereon, and the antenna trace is operable to alternately transmit a signal to and receive a signal from the transponder when the key is positioned in the ignition switch.

19 Claims, 4 Drawing Sheets

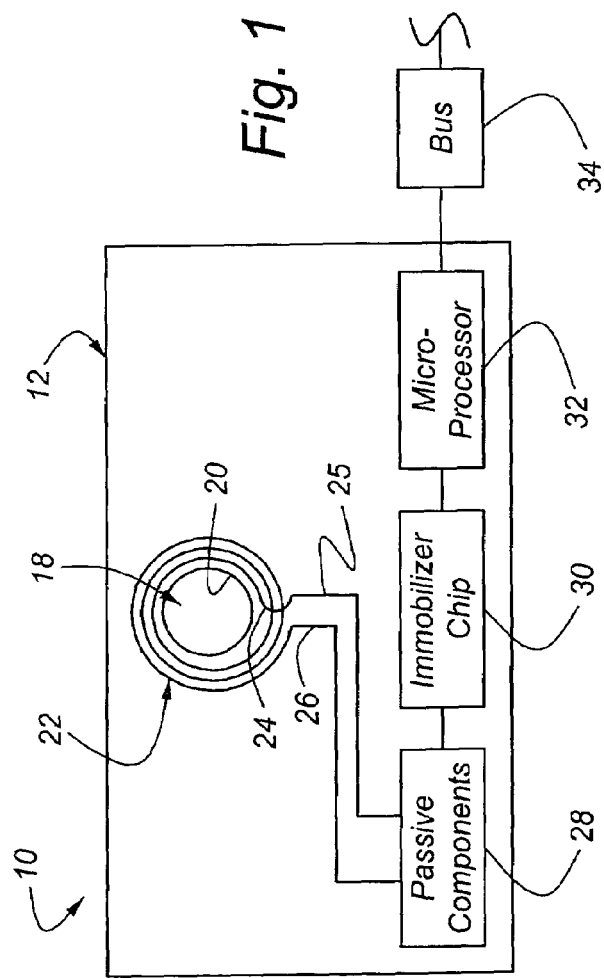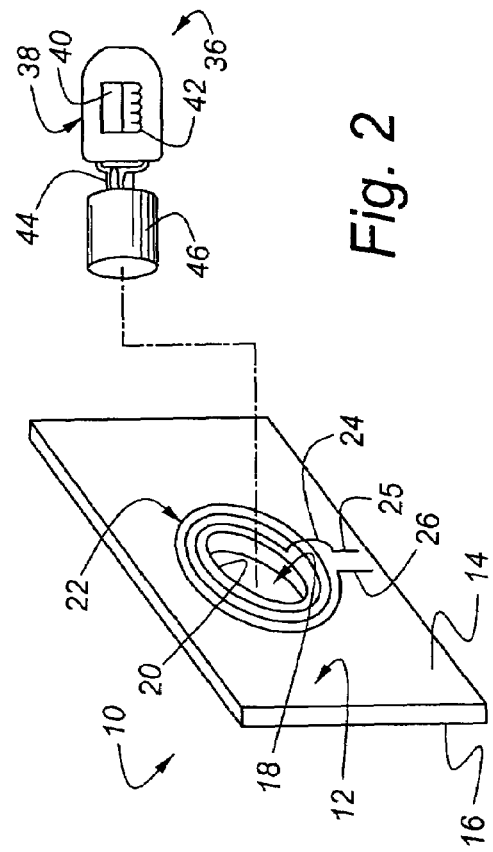

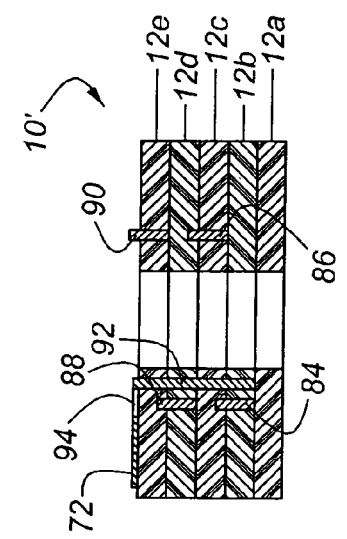
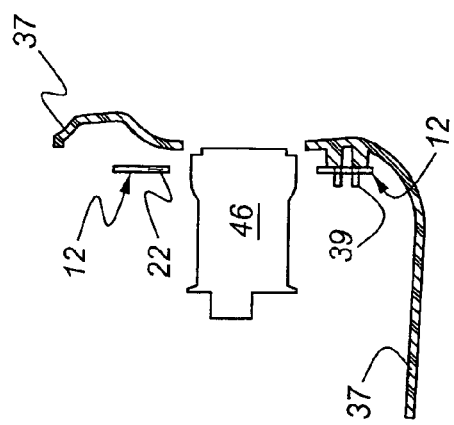
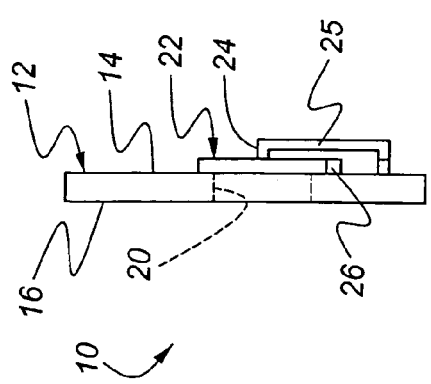
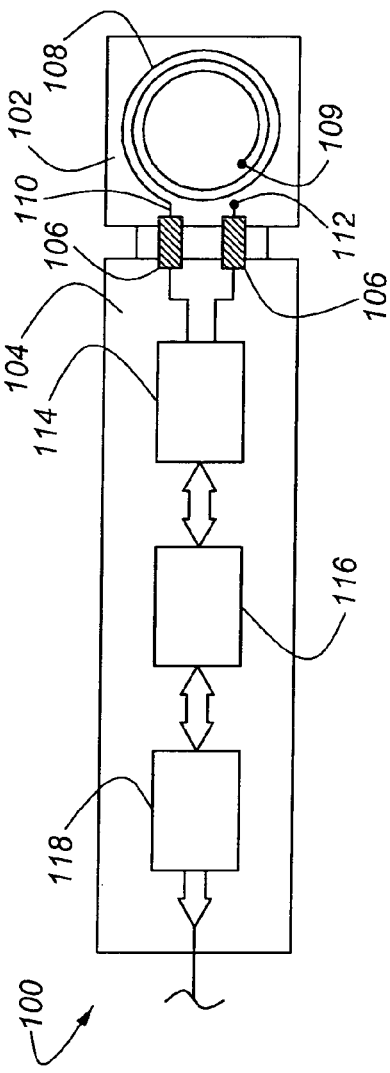

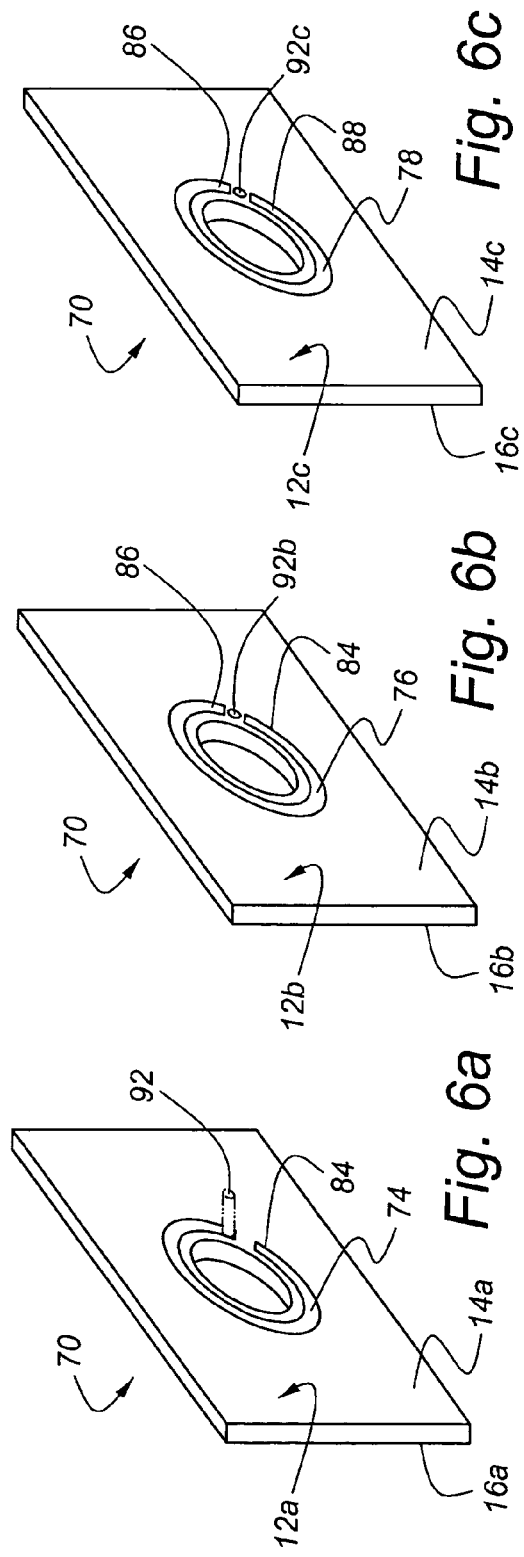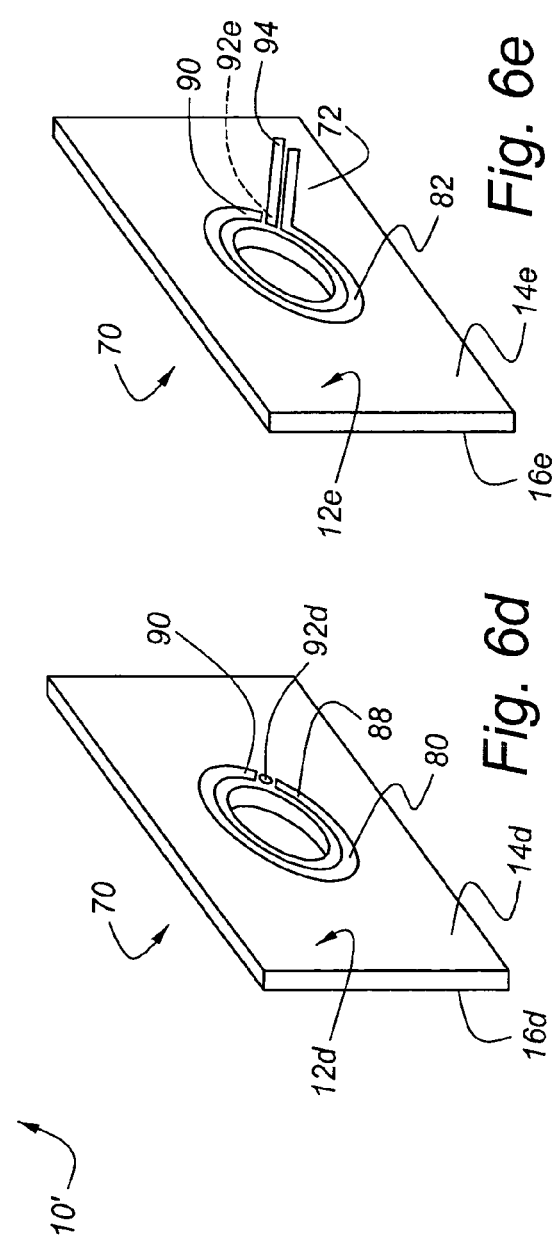

CIRCUIT BOARD ASSEMBLY WITH INTEGRAL ANTENNA

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates generally to communications, security, and immobilizer systems for vehicles and, in particular, to a circuit board assembly including an integral antenna printed thereon for use in a vehicle immobilizer system.

A vehicle engine is typically started by inserting an ignition key into an ignition lock cylinder of an ignition switch assembly and then turning the ignition key. In order to prevent unauthorized use of a vehicle, electronic immobilizer systems are installed in conjunction with the vehicle's ignition system. The immobilizer system uses an inductive link between a transponder contained in the ignition key and an antenna placed adjacent the ignition lock cylinder. After receiving a signal from the antenna, the transponder contained in the key transmits an immobilizer identification code, which is received by the antenna and transmitted to the vehicle controller. When an identification code transmitted from the transponder of the key matches an identification code preset in the vehicle's controller, the controller allows the engine to be started. The engine, therefore, may only be started by the use of a key incorporating a transponder that transmits a proper identification code.

A continuing goal in immobilizer system design is to efficiently couple energy between the transponder and the antenna and minimize interference with other devices. The optimum means for achieving this is to locate the antenna closer to the key and preferably surrounding the key.

From a manufacturing perspective, it is desirable to locate the antenna on the circuit board that includes the transceiver components that are driving the antenna. Even when installed within the steering column, the circuit board and the antenna have been relatively farther away from the key. This traditionally requires mechanical antenna components, which are disadvantageously costly.

It is desirable to obtain improved antenna performance while lowering the cost of the antenna and improving packaging of the circuit board including the transceiver components that drive the antenna.

SUMMARY OF THE INVENTION

A circuit board assembly for use in a vehicle immobilizer system in accordance with the present invention includes a printed circuit board for mounting in an interior portion of the vehicle and having an aperture formed therethrough. The aperture is defined by an interior wall of the printed circuit board. An antenna trace is printed on the circuit board proximate to the interior wall defining the aperture. An ignition switch assembly extends through the aperture of the circuit board. The ignition switch is operable to receive a key having a transponder disposed thereon, and the antenna trace is operable to alternately transmit a signal to and receive a signal from the transponder when the key is positioned in the ignition switch.

The antenna trace and the aperture formed in the printed circuit board may be formed in any shape including, but not limited to, circular, elliptical, square, rectangular, or triangular, that is advantageous to alternately transmit a signal to and receive a signal from the transponder when the key is positioned in the ignition switch.

The circuit board assembly in accordance with the present invention may advantageously be adapted to be mounted to a steering column (for those ignition switches mounted on steering columns), an instrument panel (for those ignition switches mounted on mounted on instrument panels, or any other location in the vehicle interior where the ignition switch has been located, such as a transmission shift assembly or the like.

The circuit board assembly in accordance with the present invention provides an antenna as part of a circuit board assembly for an immobilizer system that reduces the amount of space occupied by the components of the immobilizer system, reduces production cost, and simplifies production of the immobilizer system.

DESCRIPTION OF THE DRAWINGS

The above, as well as other advantages of the present invention, will become readily apparent to those skilled in the art from the following detailed description of a preferred embodiment when considered in the light of the accompanying drawings in which:

FIG. 1 is a schematic front elevation view of a circuit board assembly in accordance with the present invention;

FIG. 2 is a schematic perspective view of the circuit board assembly of FIG. 1 shown with an ignition switch assembly;

FIG. 4 is a side elevation view of an the circuit board assembly of FIG. 1;

FIG. 5 is a cross-sectional view of the circuit board assembly of FIG. 1 shown adjacent a mounting surface;

FIGS. 6a through 6e are perspective views of a circuit board assembly in accordance with the present invention having an alternative embodiment of an antenna trace printed thereon and shown in various stages of assembly;

FIG. 7 is a cross-sectional view of the circuit board assembly of FIGS. 6a through 6e;

FIG. 8 is a schematic view of an alternative embodiment of a circuit board assembly in accordance with the present invention.

DESCRIPTION OF THE PREFERRED EMBODIMENT

Figure 3:
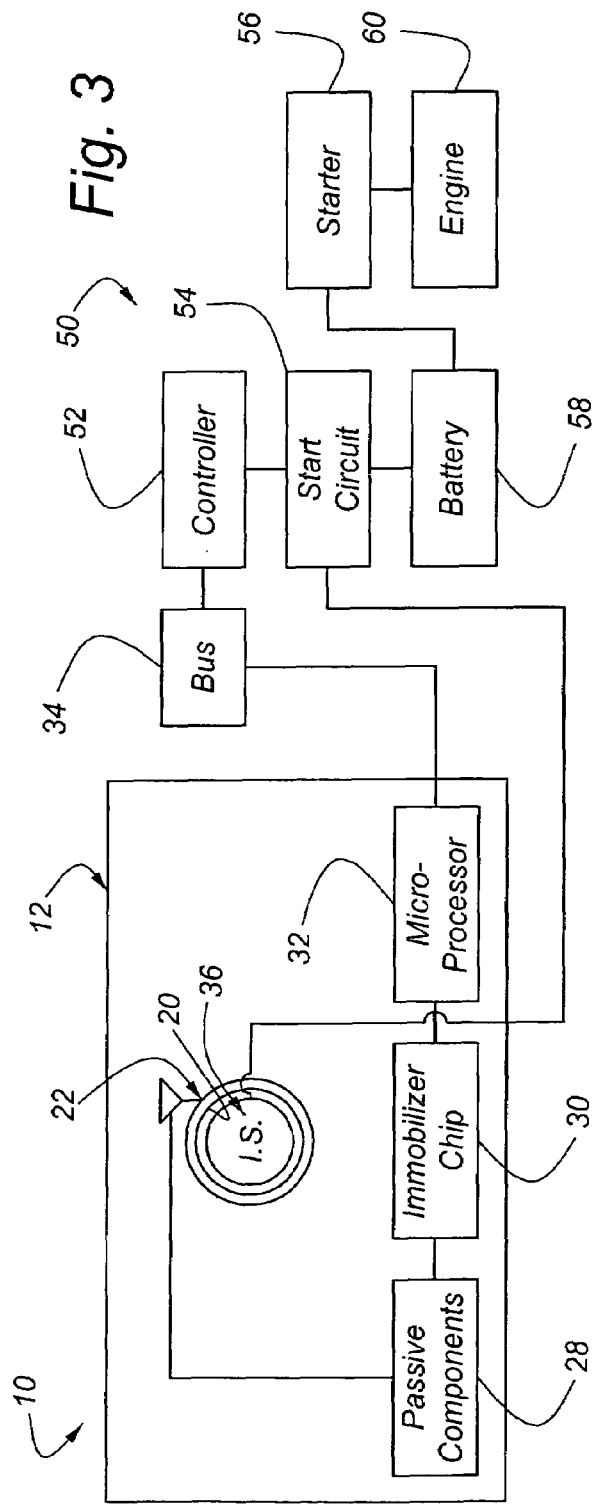
FIG. 3 is a schematic view of the circuit board assembly and ignition switch of FIG. 2 shown with an immobilizer system.

Referring now to FIGS. 1–4, a circuit board assembly for use in a vehicle immobilizer system in accordance with the present invention is indicated generally at 10. The circuit board assembly 10 includes a substantially rectangular printed circuit board 12 having a first side 14 and a second side 16, best seen in FIG. 4. The circuit board 12 is preferably substantially planar. The circuit board 12, though shown as substantially rectangular, may be formed in any advantageous shape such as square, rectangular, circular or the like. The circuit board 12 includes an aperture 18 formed therethrough that is defined by an interior wall 20 of the circuit board 12. The aperture 18, though shown as substantially circular, may be formed in any advantageous shape such as elliptical, square, rectangular, triangular or the like.

An antenna trace 22 is printed on the first side 14 of the circuit board 12 proximate to the interior wall 20 that defines the aperture 18. The antenna trace 22 is preferably formed of copper or a similar material having good electrical conductivity properties. The antenna trace 22 is preferably formed in a substantially circular or spiral coil and includes at least two antenna feed points or leads 24 and 26 extending therefrom, best seen in FIGS. 1 and 2. The antenna trace 22 preferably includes multiple coil turns to form the antenna trace 22. The antenna trace 22 has a predetermined thickness, which is determined by the requirements of the circuit board assembly 10. The antenna trace 22 is spaced apart from the interior wall 20 by a predetermined distance that is determined by the requirements of the circuit board assembly 10. The antenna trace 22, though shown as substantially circular, may be formed in any shape including, but not limited to, elliptical, square, rectangular, triangular or the like. The antenna trace 22 is preferably coplanar with the substantially planar circuit board 12.

The leads 24 and 26 of the antenna trace 22 are each connected to at least one but preferably a plurality of passive components 28, including, but not limited to, a capacitor(s), a resistor(s), and the like as will be appreciated by those skilled in the art. The passive components 28 are mounted on the first side 14 of the circuit board 12. The passive components 28 are coupled to an immobilizer chip 30, such as an integrated circuit (IC) or ASIC chip, that is mounted on the first side 14 of the circuit board 12, which is coupled to a microprocessor 32 that is also mounted on the first side 14 of the circuit board 12. The microprocessor 32 is in communication with and coupled to an interface connection or communication bus 34. Preferably, the communication bus 34 is a multiplex two-wire bus in conformance with SAE standard J1850. Alternatively, the communication bus 34 is a single wire bus or the like and may or may not include several modules (not shown) coupled to the bus 34. The communication bus 34 connects the circuit board assembly 10 with the control system of the vehicle, discussed in more detail below. Alternatively, while the connections between the antenna leads 24 and 26 and the passive components 28 remain the same, all or part of the passive components 28, the immobilizer chip 30, and the microprocessor 32 may be located external to the printed circuit board 12, such as on an adjacent circuit board (not shown) or the like, as will be appreciated by those skilled in the art.

As seen in FIG. 1, the antenna trace 22 is a single coil printed on the first side 14 of the circuit board 12 in a substantially spiral or helical configuration. The outer lead 26 is directly connected to the passive components 28 and the inner lead 24 is connected to the passive components 28 by a jumper wire 25 or the like.

The aperture 18 of the circuit board 12 is operable to receive an ignition switch assembly 36, best seen in FIG. 2. The ignition switch assembly 36 includes an electronic key 38 having a transponder 40 and an antenna 42 disposed thereon. The transponder 40 includes an identification code stored therein for use in an immobilizer system, discussed in more detail below. A bit or shank portion 44 of the key 38 is operable to be inserted into an aperture (not shown) in a lock cylinder 46, which is substantially circular in cross section to correspond to the substantially circular aperture 18 formed in the circuit board 12. Those skilled in the art will appreciate that the aperture 18, the lock cylinder 46, and the antenna 22 may be formed in any shape that is advantageous for communicating between the antenna 22 and the antenna 42, discussed in more detail below. When assembled, the lock cylinder 46 of the ignition switch assembly 36 extends through the aperture 18 of the printed circuit board 12.

Referring now to FIG. 3, the circuit board assembly 10 with the ignition switch assembly 36 disposed therein and extending through the aperture 18 is shown in schematic view. A vehicle immobilizer system, indicated generally at 50, includes a controller 52, such as, but is not limited to, an engine control module or the like. The controller 52 is in communication with a starting circuit 54, which is electrically connected to a starter 56. The starter 56 is connected to a battery 58 and an engine 60. The controller 52 of the vehicle immobilizer system 50 is in coupled to and communication with the circuit board assembly 10 through the communication bus 34.

The circuit board assembly 10 is adapted to be installed in an interior portion of a vehicle (not shown), to a mounting surface 37, best seen in FIG. 5, such as a steering column (for those ignition switch assemblies 36 mounted on steering columns), an instrument panel (for those ignition switch assemblies 36 mounted on mounted on instrument panels) or any other location in the vehicle interior where the ignition switch assembly 36 has been located, such as adjacent a transmission gear shifter or the like. The mounting surface 37 preferably includes a support 39, best seen in FIG. 5, molded as a part of the mounting surface for attaching the circuit board assembly thereto. Alternatively, the support 39 is a secondary assembly attached to each of the circuit board assembly 10 and the mounting surface 37.

In operation, when the key 38 is positioned in a starting position in the lock cylinder 46 of the ignition switch assembly 36, a signal is sent from the controller 52 of the immobilizer system 50 (via the communication bus 34, the microprocessor 32, the immobilizer chip 30, and the passive components 28) to the antenna trace 22 to transmit a signal of a predetermined duration. The signal from the antenna trace 22 is received by the antenna 42 on the key 38, which provides power to the transponder 40 and the antenna 42. After the predetermined duration transmission signal from the antenna trace 22 ceases, the transponder 40 provides an identification code signal to the antenna 42, which transmits a signal including the identification code. The signal transmitted from the antenna 42 is received by the antenna trace 22, and sent to the immobilizer chip 30 through the passive components 28. The antenna trace 22, therefore, alternately transmits a signal to and receives a signal from the transponder 40 when the key 38 is positioned in the ignition switch assembly 36.

The immobilizer chip 30 decodes the signal received from the antenna trace 22 and obtains the identification code and further transmits the identification code to the controller 52 (via the microprocessor 32 and the communication bus 34), which compares the identification code from the transponder 40 with valid identification codes stored in the controller 52. If the identification code from the transponder 40 is a valid code, the controller 52 transmits a signal to the starting circuit 54, allowing battery 58 to provide power to the starter 56 and start the engine 60. If the identification code from the transponder 40 is not a valid code, the controller 52 transmits a signal to the starting circuit 54 to prevent or immobilize the starter 56 from starting the engine 60. The proximity of the antenna trace 22 to the ignition switch assembly 36 allows the antenna trace 22 to be sized smaller than the antennas of the prior art located remote from the ignition switch assembly 36, advantageously reducing the amount of space occupied by the circuit board assembly 10 and the immobilizer system 50.

Referring now to FIGS. 6a–7, an alternative embodiment of a multi-layer printed circuit board assembly 10' includes an alternative embodiment of an antenna trace, indicated generally at 70, printed thereon. The antenna trace 70 is formed in a first coil or layer 74, a second layer 76, a third layer 78, a fourth layer 80, and a fifth layer 82. The first layer 74 is printed on a first or lower circuit board layer 12a. The second layer 76 is printed on a second circuit board layer 12b. The third layer 78 is printed on a third circuit board layer 12c. The fourth layer 80 is printed on a fourth circuit board layer 12d. The fifth layer 82 is printed on a fifth or upper circuit board layer 12e. The first layer 74 includes a first lead 72, similar to the lead 26 shown in FIGS. 1 and 3, for attachment to passive components of the circuit board assembly 10, such as the passive components 28 shown in FIGS. 1 and 3. Those skilled in the art will appreciate that circuit board layers 12a, 12b, 12c, 12d, and 12e form the multi-layer circuit board assembly 10' when assembled as shown in FIG. 7.

The first layer 74 and the second layer 76 are connected by a via 84. The second layer 76 and the third layer 78 are connected by a via 86. The third layer 78 and the fourth layer 80 are connected by a via 88. The fourth layer 80 and the fifth layer 82 are connected by a via 90. The vias 84, 86, 88, and 90 ensure that the layers 74, 76, 78, 80, and 82 are in series. A through via 92 extends from the fifth layer 82 through an aperture 92e in the circuit board layer 12e, through an aperture 92d in the circuit board layer 12d, through an aperture 92c in the circuit board layer 12c, through an aperture 92b in the circuit board layer 12b, to the first layer 74. The through via 92 extends to a second lead 94, similar to the lead 24 shown in FIGS. 1 and 3, for attachment to the passive components, such as the passive components 28 of the circuit board assembly 10. Although five layers are shown, more or fewer layers may be utilized to form the antenna trace 70

The antenna trace 70 is assembled by printing the first layer 74 including the via 84 and the through via 92 on the first side 14a of the circuit board layer 12a, as shown in FIG. 6a. The second layer 76 including the via 86 is then printed on the first side 14b of the circuit board layer 12b and connected to the first layer 82 through the via 84, as shown in FIG. 6b. The third layer 78 including the via 88 is printed on the first side 14c of the circuit board layer 12c and connected to the second layer 76 through the via 86, as shown in FIG. 6c. The fourth layer 80 including the via 90 is printed on the first side 14d of the circuit board layer 12d and connected to the third layer 78 through the via 88, as shown in FIG. 6d. The fifth layer 82 including the first lead 72 and the via 90 and the second lead 94 is printed on the first side 14e of the circuit board layer 12e and connected to the second layer 76 through the via 84 and the second lead 94 is connected to the through via 92, as shown in FIG. 6e. Although only one turn is shown in each layer of the antenna trace 70, each layer could contain multiple turns as shown in FIGS. 1 and 2. Although the vias 84, 86, 88, and 90 are shown as partial vias, each of the vias 84, 86, 88, and 90 could also be through vias, similar to the through via 92, wherein the antenna layers 74, 76, 78, 80, and 82 are each connected in series to a respective through via.

Those skilled in the art will appreciate that more than two leads, such as the leads 24 and 26 may extend from the antenna trace 22 or 22', such as, for example, three leads to form a tapped coil antenna or the like while remaining within the scope of the present invention.

Referring now to FIG. 8, an alternative embodiment of a circuit board assembly is indicated at 100. The circuit board assembly 100 includes a first multi-layer printed circuit board 102 and a second multi-layer printed circuit board 104 connected by a flexible electrical connection such as a pair of flexible metal bars 106 placed on the PCB pads during PCB component placement during construction of the circuit boards 102 and 104. Alternatively, the flexible electrical connection is a flexible circuit board or the like. Preferably, the multi-layer printed circuit boards 102 and 104 are each formed having an equal number of circuit board layers. The first circuit board 102 includes an antenna trace 108 formed thereon. If the first circuit board 102 is a single layer circuit board, the antenna trace 108 is preferably formed in a single layer, such as the antenna trace 22. If the first circuit board 102 is a multi-layer circuit board, the antenna trace 108 is formed in multiple layers, such as the antenna trace 70 and would include a through via, similar to the through via 92, at a point 109 to attach to the other antenna layers (not shown). The antenna trace 108 includes at least two antenna feed points or leads 110 and 112 extending therefrom for attachment to a respective bar 106. The bars 106, in turn, are connected to passive components 114, similar to the passive components 38 of the circuit board assembly 10 of FIGS. 1 and 3. The passive components 114 are connected to a microchip 116, similar to the immobilizer chip 40 of the circuit board assembly 10 of FIGS. 1 and 3. The microchip 116 is connected to communication bus 118, similar to the bus 34 of the circuit board assembly 10 of FIGS. 1 and 3. The circuit boards 102 and 104 may be attached by the bars 106 in a substantially parallel configuration, in a substantially perpendicular configuration or any other type of configuration or orientation.

The circuit board assembly 100 is preferably placed adjacent an ignition switch assembly, such as the ignition switch assembly 38 of FIG. 2. In such a configuration, neither the circuit board 102 nor the circuit board 104 need have an aperture formed therein to receive the ignition switch assembly in order to function with an immobilizer system.

Figure 9:
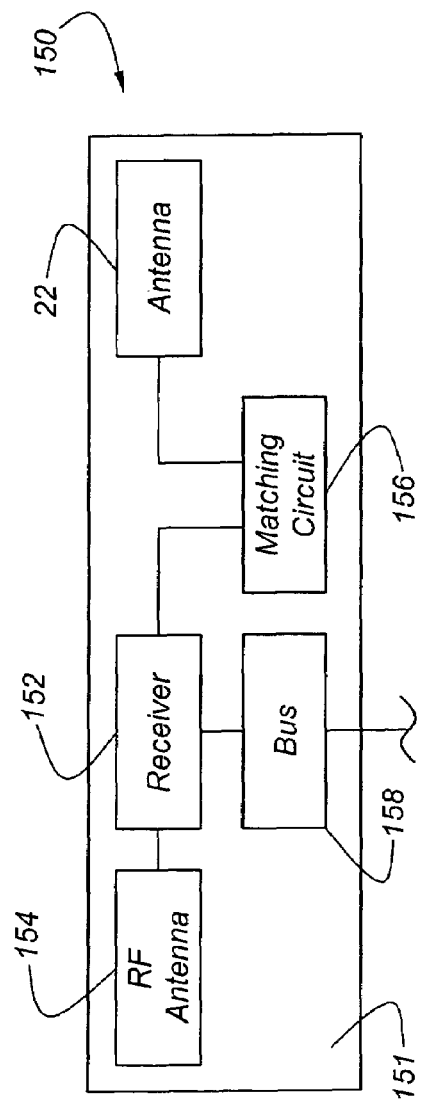
FIG. 9 is a schematic view of an alternative embodiment of a circuit board assembly in accordance with the present invention.

Referring now to FIG. 9, the antenna trace 22 is utilized as part of a remote keyless entry system 150. The antenna trace 22 is printed on a circuit board 151 and connected to a receiver 152 through a matching circuit 156. The receiver 152 is coupled to a RF antenna 154 and a bus 158. The receiver 152, RF antenna 154, matching circuit 156, and bus 158 are mounted on the circuit board 151 and function as is well known in the art. Alternatively, the antenna trace 70 is substituted for the antenna trace 22 if the circuit board assembly is a multi-layer circuit board.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. A circuit board assembly for use in a vehicle immobilizer system, comprising:
  a single-layer printed circuit board for mounting in an interior portion of the vehicle and having an aperture formed therethrough, said aperture being defined by an interior wall of said single-layer printed circuit board;

an antenna trace printed on said single-layer printed circuit board proximate to said interior wall defining said aperture;

at least one passive component, an immobilizer chip, and a microprocessor disposed on said single-layer printed circuit board and in communication with said antenna trace; and an ignition switch assembly extending through said aperture of said circuit board, said ignition switch assembly operable to receive a key having a transponder disposed thereon, said antenna trace operable to alternately transmit a signal to and receive a signal from said transponder when said key is positioned in said ignition switch assembly.

2. The circuit board assembly according to claim 1 wherein said circuit board is substantially planar and said antenna trace is coplanar with said circuit board.

3. The circuit board assembly according to claim 1 wherein said aperture is substantially circular.

4. The circuit board assembly according to claim 2 wherein said antenna trace is substantially circular.

5. The circuit board assembly according to claim 1 wherein said antenna trace includes at least two antenna leads extending therefrom.

6. The circuit board assembly according to claim 5 wherein said at least one passive component is attached to said at least two antenna leads, said immobilizer IC being coupled to said at least one passive component, and said microprocessor being coupled to said immobilizer IC.

7. The circuit board assembly according to claim 6 wherein said microprocessor is adapted to be coupled to a communication bus.

8. A circuit board assembly for use in a vehicle immobilizer system, comprising:

at least one multi-layer printed circuit board for mounting in an interior portion of the vehicle, said at least one multi-layer printed circuit board having an aperture formed therethrough, said aperture being defined by an interior wall of said multi-layer printed circuit board;

an antenna trace disposed on said multi-layer printed circuit board proximate to said interior wall defining said aperture;

at least one passive component, an immobilizer chip, and a microprocessor disposed on said at least one multi-layer printed circuit board and in communication with said antenna trace; and an ignition switch assembly extending through said aperture of said multi-layer printed circuit board, said ignition switch assembly operable to receive a key having a transponder disposed thereon, said antenna trace operable to alternately transmit a signal to and receive a signal from said transponder when said key is positioned in said ignition switch assembly.

9. The circuit board assembly according to claim 8 wherein said interior wall defining said aperture is substantially circular.

10. The circuit board assembly according to claim 8 wherein said antenna trace is substantially circular.

11. The circuit board assembly according to claim 8 wherein said antenna trace includes at least two antenna leads extending therefrom.

12. The circuit board assembly according to claim 11 wherein said at least one passive component is attached to said at least two antenna leads, said immobilizer chip being attached to said at least one passive component, and said microprocessor being attached to said immobilizer chip.

13. The circuit board assembly according to claim 12 wherein said microprocessor is adapted to be attached to a communication bus.

14. The circuit board assembly according to claim 8 wherein said antenna trace is formed in a plurality of layers, each of said layers being separated by a circuit board layer and connected by vias.

15. A circuit board assembly for use in an immobilizer system for a vehicle, comprising:

a first printed circuit board for mounting to a mounting surface in an interior of said vehicle;

an antenna trace printed on said first printed circuit board;

a second printed circuit board separate from said first printed circuit board and having at least one passive component attached thereto, said one at least passive component in communication with said antenna trace; and a first lead of said antenna trace connected to a first metal bar, and a second lead of said antenna trace connected to a second metal bar, said first and second metal bars connected to said first printed circuit board and said second printed circuit board for providing a connection between said second printed circuit board and said antenna trace of said first printed circuit board, said first and second metal bars being capable of bending for orienting said first printed circuit board in a different plane than said second printed circuit board.

16. The circuit board assembly according to claim 15 further comprising an immobilizer IC and a microprocessor, wherein said at least one passive component is attached to said first and second leads, said immobilizer IC being coupled to said at least one passive component, and said microprocessor being coupled to said immobilizer IC, said at least one passive component, said immobilizer IC and said microprocessor being mounted on said another circuit board.

17. The circuit board assembly according to claim 16 wherein said first printed circuit board and said second printed circuit board are multi-layer printed circuit boards.

18. The circuit board assembly according to claim 17 wherein said first printed circuit board and said second printed circuit board comprise at least three circuit boards layers including a lower circuit board layer and an upper circuit board layer.

19. The circuit board assembly according to claim 18 wherein said antenna trace includes a through via extending between said lower circuit board layer and said upper circuit board layer and connected to a one of said first lead and said second lead.

* * * * *